(12) United States Patent
Watanabe et al.

(10) Patent No.: US 11,262,403 B2
(45) Date of Patent: Mar. 1, 2022

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Yuki Watanabe, Funabashi Chiba (JP); Toshiaki Dozaka, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 16 days.

(21) Appl. No.: 16/797,454

(22) Filed: Feb. 21, 2020

(65) Prior Publication Data

US 2021/0063489 A1 Mar. 4, 2021

(30) Foreign Application Priority Data

Sep. 2, 2019 (JP) .............................. JP2019-159812

(51) Int. Cl.
*G01R 31/3185* (2006.01)
*G01R 31/3177* (2006.01)

(52) U.S. Cl.
CPC . *G01R 31/318536* (2013.01); *G01R 31/3177* (2013.01); *G01R 31/318541* (2013.01); *G01R 31/318552* (2013.01); *G01R 31/318555* (2013.01)

(58) Field of Classification Search
CPC ........ G01R 31/318536; G01R 31/3177; G01R 31/318541; G01R 31/318552; G01R 31/318555

USPC .......................... 714/724, 726, 728, 729, 731
See application file for complete search history.

(56) References Cited

U.S. PATENT DOCUMENTS

| 6,904,553 B1 * | 6/2005 | Brown | G01R 31/318594 714/729 |
| 7,038,494 B2 * | 5/2006 | Morton | G01R 31/318541 326/93 |
| 7,216,315 B2 * | 5/2007 | Yoshida | G06F 30/33 716/55 |

(Continued)

FOREIGN PATENT DOCUMENTS

| JP | 2004-199705 A | 7/2004 |
| JP | 3549428 B2 | 8/2004 |
| JP | 4232477 B2 | 3/2009 |

OTHER PUBLICATIONS

Yoshida et al., A New Approach for Low Power Scan Testing, 2003, IEEE, pp. 480-487. (Year: 2003).*

*Primary Examiner* — John J Tabone, Jr.
(74) *Attorney, Agent, or Firm* — Allen & Overy LLP

(57) ABSTRACT

According to one embodiment, a semiconductor device includes: a first scan chain and a second scan chain each including a plurality of cascaded flip-flops; a plurality of power supply lines that supply a power supply voltage to the first and second scan chains, extend in a first direction, and are arranged in a second direction intersecting with the first direction; and a clock control circuit that supplies a first clock to the first scan chain and a second clock to the second scan chain, the second clock having timing different to that of the first clock. The plurality of flip-flops are arranged along the second direction.

20 Claims, 10 Drawing Sheets

(56) References Cited

U.S. PATENT DOCUMENTS

| | | | | |
|---|---|---|---|---|
| 7,373,568 | B1* | 5/2008 | Horovitz | G01R 31/318594 714/726 |
| 10,088,525 | B2* | 10/2018 | Kawoosa | G01R 31/31713 |
| 2004/0078741 | A1* | 4/2004 | Morton | G01R 31/318594 714/726 |
| 2004/0250185 | A1* | 12/2004 | Date | G01R 31/318572 714/726 |
| 2008/0222471 | A1* | 9/2008 | Sul | G01R 31/318575 714/731 |
| 2009/0132879 | A1* | 5/2009 | Gangappa | G01R 31/318572 714/729 |
| 2009/0240996 | A1* | 9/2009 | Sasaya | G01R 31/318594 714/729 |
| 2012/0331361 | A1* | 12/2012 | Wang | G01R 31/3177 714/729 |
| 2016/0003901 | A1* | 1/2016 | Park | G01R 31/318555 714/727 |
| 2018/0074122 | A1* | 3/2018 | Payne | G01R 31/318536 |
| 2018/0088176 | A1* | 3/2018 | Uemura | G01R 31/3177 |
| 2018/0246996 | A1* | 8/2018 | Odiz | G06F 30/392 |

* cited by examiner

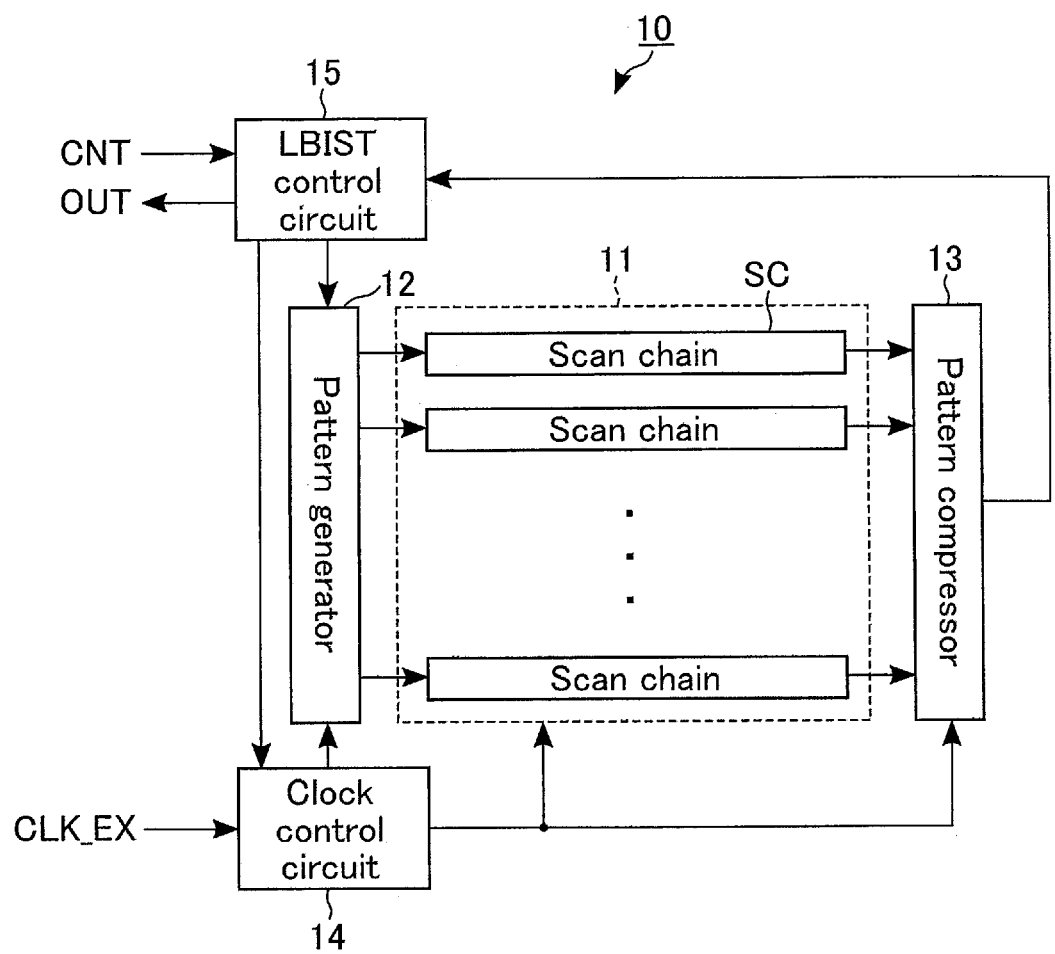
F I G. 1

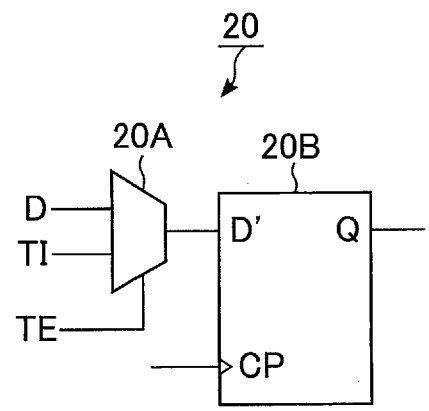
F I G. 3
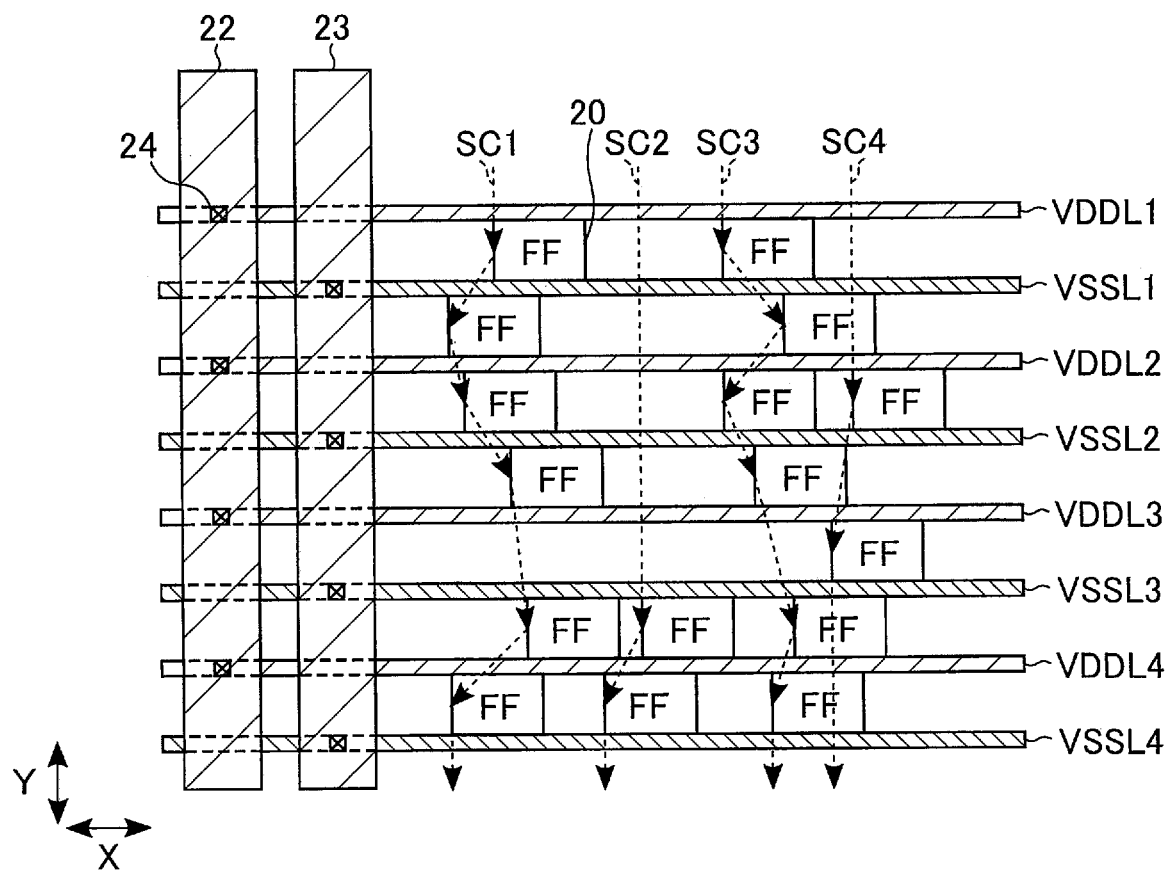
F I G. 4

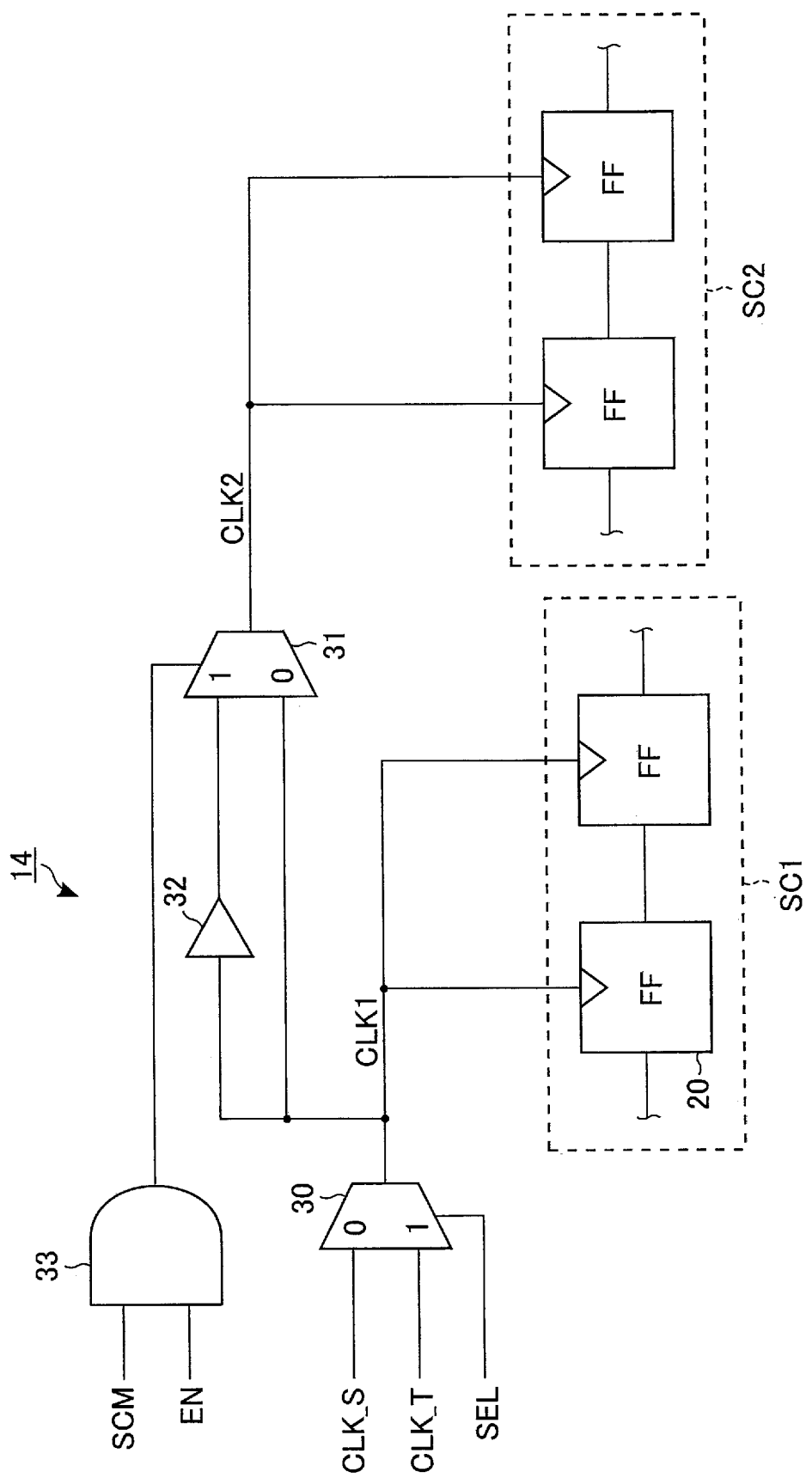
F I G. 6

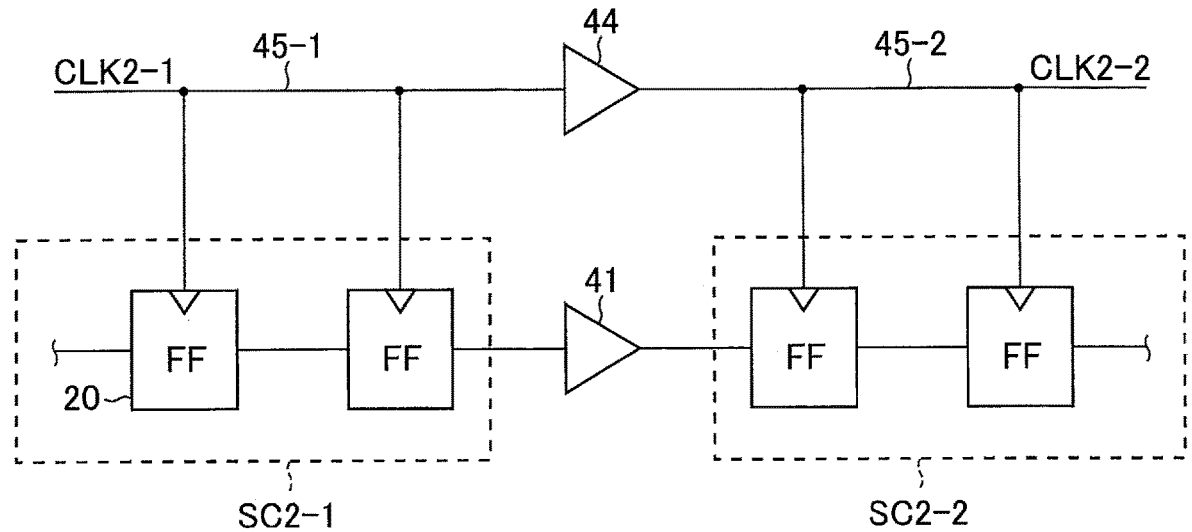
F I G. 11
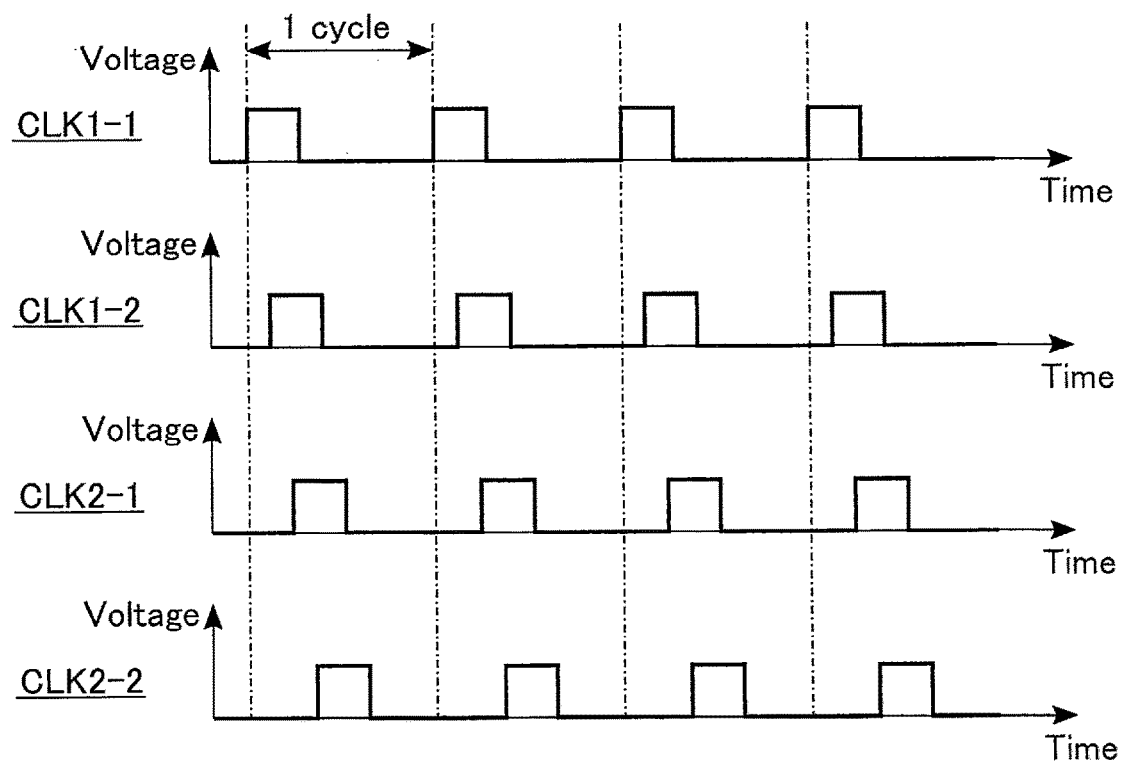
F I G. 12

SEMICONDUCTOR DEVICE

CROSS-REFERENCE TO RELATED APPLICATIONS

This application is based upon and claims the benefit of priority from Japanese Patent Application No. 2019-159812, filed Sep. 2, 2019, the entire contents of which are incorporated herein by reference.

FIELD

Embodiments described herein relate generally to a semiconductor device.

BACKGROUND

As techniques for solving difficulties in testing large-scale, complicated semiconductor integrated circuits, compression scan testing and logic built-in self-testing (logic BIST, or LBIST) for a logic circuit provided with a scan chain are known. It is possible to use the logic BIST not only for an initial diagnosis at the time of manufacturing semiconductor integrated circuits but also for a continuous diagnosis during an operation of semiconductor integrated circuits.

In logic BIST, a test pattern is generated and input to a logic circuit. A testing result output from the logic circuit is then compressed, and the compression value is analyzed. In logic BIST, these operations are automatically performed within a semiconductor integrated circuit.

A logic circuit is provided with a plurality of scan chains each having a plurality of cascaded flip-flops. If a plurality of flip-flops coupled to a power supply line simultaneously operate during a test using a scan chain, a peak power increases, and a local voltage drop occurs in said power supply line. The test may not properly execute due to this local voltage drop. As a consequence, a normal semiconductor integrated circuit may be determined to be defective.

BRIEF DESCRIPTION OF THE DRAWINGS

FIG. 1 is a block diagram showing a semiconductor device according to a first embodiment.
FIG. 3 is a circuit diagram showing another structure of a scan flip-flop.
FIG. 4 is a plan view of a logic circuit that includes a plurality of scan chains according to the first embodiment.
FIG. 6 is a circuit diagram of a clock control circuit.
FIG. 11 is a circuit diagram for explaining a scan chain and a clock signal line.
FIG. 12 is a timing diagram of clock signals during testing.

DETAILED DESCRIPTION

Figure 2:
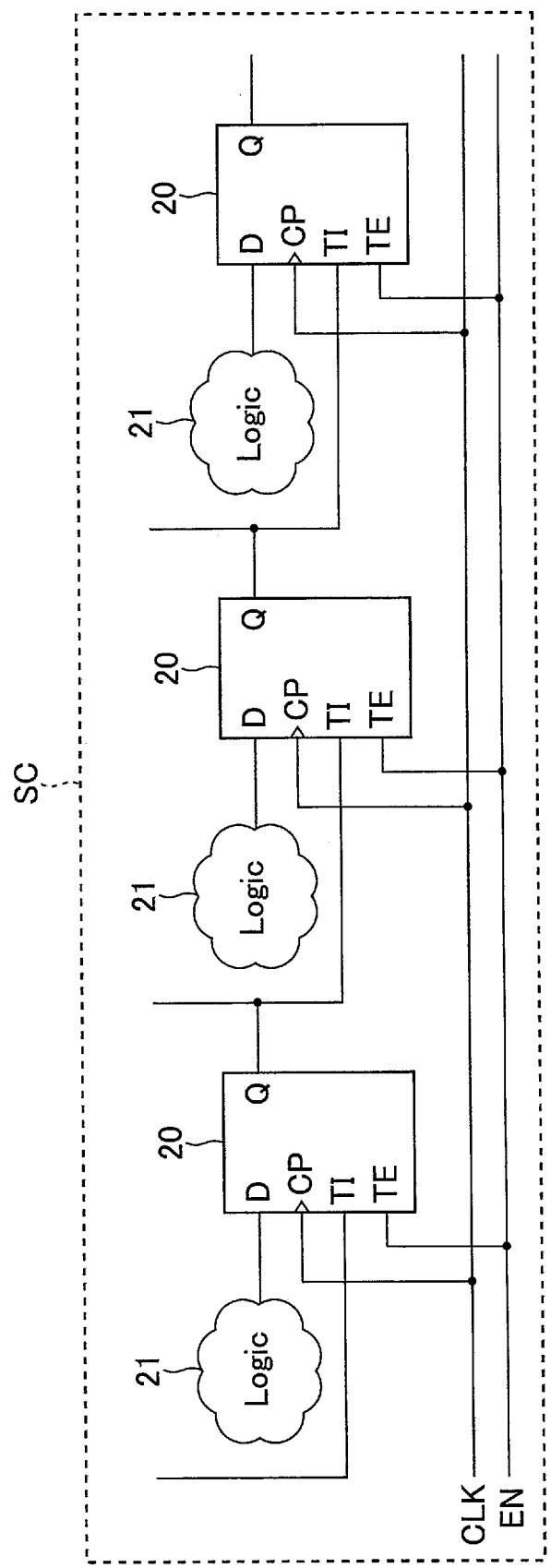
FIG. 2 is a circuit diagram of a part of a scan chain.

In general, according to one embodiment, there is provided a semiconductor device comprising:
a first scan chain and a second scan chain each including a plurality of cascaded flip-flops;
a plurality of power supply lines that supply a power supply voltage to the first and second scan chains, extend in a first direction, and are arranged in a second direction intersecting with the first direction; and
a clock control circuit that supplies a first clock to the first scan chain and a second clock to the second scan chain, the second clock having timing different to that of the first clock, wherein
the plurality of flip-flops are arranged along the second direction.

Hereinafter, embodiments will be described with reference to the accompanying drawings. The following embodiments will present an example of a device and a method for carrying out the technical concept of the present invention, and it is to be understood that the technical concept of the present invention is not specified by the shapes, the structures, the arrangements, and the like of the constituent components. In the description below, structural elements having substantially the same functions and configurations will be denoted by the same reference symbols, and a repetitive description of such elements will be given only where necessary.

[1] First Embodiment

[1-1] Structure of Semiconductor Device

FIG. 1 is a block diagram showing a semiconductor device 10 according to the first embodiment. Suppose the semiconductor device 10 executes an LBIST, for example. The semiconductor device 10 includes a logic circuit 11, a pattern generator 12, a pattern compressor 13, a clock control circuit 14, and an LBIST control circuit 15.

The logic circuit 11 is a circuit that realizes a system operation of the semiconductor device 10 and also a test-target circuit. The logic circuit 11 includes a plurality of scan chains SC. The structure of the scan chains SC will be described later.

The pattern generator 12 generates a plurality of test patterns. A single test pattern is input in parallel to a plurality of scan chains SC. A plurality of test patterns are input per cycle and sequentially to a plurality of scan chains SC. The pattern generator 12 is, for example, a pseudo random pattern generator (PRPG), and it generates pseudo random patterns as test patterns.

The pattern compressor 13 receives output data from the plurality of scan chains SC. The pattern compressor 13 sequentially and cumulatively compresses test results corresponding to a plurality of test patterns, and outputs a compression value. The compression value of the pattern compressor 13 is sent to the LBIST control circuit 15. The pattern compressor 13 is a multiple input signature register (MISR), for example.

The clock control circuit 14 receives a clock CLK_EX from an external device. The clock control circuit 14 generates an internal clock using the clock CLK_EX, and supplies the internal clock to the pattern generator 12, the logic circuit 11, and the pattern compressor 13.

The LBIST control circuit 15 controls a test pattern of overall semiconductor device 10. The LBIST control circuit 15 executes a test (LBIST) for the logic circuit 11 based on an externally provided control signal CNT.

The LBIST control circuit 15 compares a compression value from the pattern compressor 13 with an expected value stored in advance. Then, the LBIST control circuit 15 externally outputs a result of the comparison as a test result OUT. If the compression value and the expected value are the same, it is determined that the test has been passed.

[1-1-1] Basic Structure of Scan Chain SC

Next, a basic structure of a scan chain SC will be described. FIG. 2 is a circuit diagram of a part of a scan chain SC.

The scan chain SC includes a plurality of scan flip-flops 20. Each of the scan flip-flops 20 includes an input terminal D, an input terminal TI, a clock terminal CP, a test enable terminal TE, and an output terminal Q.

The input terminal D is an input terminal used in a normal system operation. Normal data is input to the input terminal D from a logic circuit 11.

The input terminal TI is an input terminal used in a test operation. Test data (test pattern) is input to the input terminal TI. The input terminal TI is coupled to an output terminal Q of the scan flip-flop 20 of a previous stage.

A clock CLK is input to the clock terminal CP. A state value of the scan flip-flop 20 is output from the output terminal Q.

In a normal mode, the scan flip-flop 20 synchronizes to the clock CLK, selects and stores normal data from the input terminal D, and outputs a state value for itself to the output terminal Q. On the other hand, in a test mode, the flip-flop 20 synchronizes to a clock CLK, selects and stores test data from the input terminal TI, and outputs a state value for itself to the output terminal Q. In other words, the plurality of scan flip-flops 20 are coupled in series to each other in a test mode, and sequentially transfer test data. Each scan flip-flop 20 inputs test data from a scan flip-flop 20 of the previous stage, and output test data to a scan flip-flop 20 of the next stage. Switching between the normal mode and the test mode (switching between normal data input and test data input) is performed in accordance with a scan enable signal EN.

FIG. 3 is a circuit diagram showing another structure of the scan flip-flop 20. The scan flip-flop 20 includes a selector 20A and a flip-flop 20B.

The input terminal D of the scan flip-flop 20 is coupled to a first input terminal of the selector 20A. The input terminal TI of the scan flip-flop 20 is coupled to a second input terminal of the selector 20A. The test enable terminal TE of the scan flip-flop 20 is coupled to a control terminal of the selector 20A. The selector 20A selects either one of the normal data input to the input terminal D and the test data input to the input terminal TI, in accordance with a scan enable signal EN input to the test enable terminal TE.

The flip-flop 20B is provided with an input terminal D', a clock terminal CP, and an output terminal Q. The output terminal of the selector 20A is coupled to the input terminal D' of the flip-flop 20B. The clock terminal CP of the flip-flop 20B corresponds to the clock terminal of the scan flip-flop 20. The output terminal Q of the flip-flop 20B corresponds to the output terminal of the scan flip-flop 20. The flip-flop 20B synchronizes to a clock CLK, selects and stores data from the input terminal D', and outputs a state value for itself to the output terminal Q.

[1-1-2] Specific Structure of Scan Chain SC

Next, a specific structure of a scan chain SC will be described. FIG. 4 is a plan view of the logic circuit 11 that includes a plurality of scan chains SC.

In the logic circuit 11, a plurality of power supply lines VDDL, a plurality of ground lines VSSL, and upper layer interconnects 22 and 23 are arranged. FIG. 4 shows four power supply lines VDDL1 through VDDL4, and four ground lines VSSL1 through VSSL4.

The power supply lines VDDL1 through VDDL4 are interconnects for supplying a power supply voltage VDD to the logic circuit 11 (shown as an array of FFs in FIG. 4). The ground lines VSSL1 through VSSL4 are interconnects for supplying a ground voltage VSS to the logic circuit 11.

The power supply lines VDDL1 through VDDL4 extend in an X direction, and are arranged side by side in a Y direction orthogonal to the X direction. The ground lines VSSL1 through VSSL4 extend in the X direction, and are arranged side by side in the Y direction. The power supply lines VDDL1 through VDDL4 and the ground lines VSSL1 through VSSL4 are alternatively arranged.

The upper layer interconnect 22 is an interconnect provided in an upper layer of the power supply lines VDDL1 through VDDL4, and has a wire width thicker than that of the power supply lines VDDL1 through VDDL4. In other words, the power supply line VDDL has a higher interconnect resistance than that of the upper layer interconnect 22. The upper layer interconnect 22 extends in the Y direction. The upper layer interconnect 22 is coupled to the power supply lines VDDL1 through VDDL4 via contacts 24. A power supply voltage VDD is supplied to the power supply lines VDDL1 through VDDL4 via the upper layer interconnect 22.

The upper layer interconnect 23 is an interconnecting provided in an upper layer of the ground lines VSSL1 through VSSL4, and has a wire width thicker than that of the ground lines VSSL1 through VSSL4. In other words, the ground line VSSL has a higher interconnect resistance than that of the upper layer interconnect 23. The upper layer interconnect 23 extends in the Y direction. The upper layer interconnect 23 is coupled to the ground lines VSSL1 through the VSSL4 via the contacts 24. A ground voltage VSS is supplied to the ground lines VSSL1 and VSSL4 via the upper layer interconnect 23.

The logic circuit 11 includes a plurality of scan chains SC. The plurality of scan chains SC include a plurality of scan flip-flops 20. Each of the scan flip-flops 20 are indicated as "FF" in FIG. 4. FIG. 4 shows four scan chains SC1 through SC4 as an example.

The power supply lines VDDL1 through VDDL4 supply a power supply voltage VDD to corresponding scan flip-flops 20. The ground lines VSSL1 through VSSL4 supply a ground voltage VSS to corresponding scan flip-flops 20. The power supply line VDDL in contact with a scan flip-flop 20 in FIG. 4 is coupled to the scan flip-flop 20, and supplies a power supply voltage VDD to the scan flip-flop 20. The ground line VSSL in contact with a scan flip-flop 20 is coupled to the scan flip-flop 20, and supplies a ground voltage VSS to the scan flip-flop 20.

In the present embodiment, the scan flip-flops 20 are coupled in a direction orthogonal to the power supply lines VDDL and the ground lines VSSL (the Y direction), to constitute a scan chain SC. The broken-line arrows in FIG. 4 show a coupling state and a coupling order for the scan flip-flops 20.

The scan chain SC1 is comprised of six cascaded scan flip-flops 20 arranged along the Y direction. The scan chain SC2 is comprised of two cascaded scan flip-flops 20 arranged along the Y direction. The scan chain SC3 is comprised of six cascaded scan flip-flops 20 arranged along the Y direction. The scan chain SC4 is comprised of two cascaded scan flip-flops 20 arranged along the Y direction.

Figure 5:
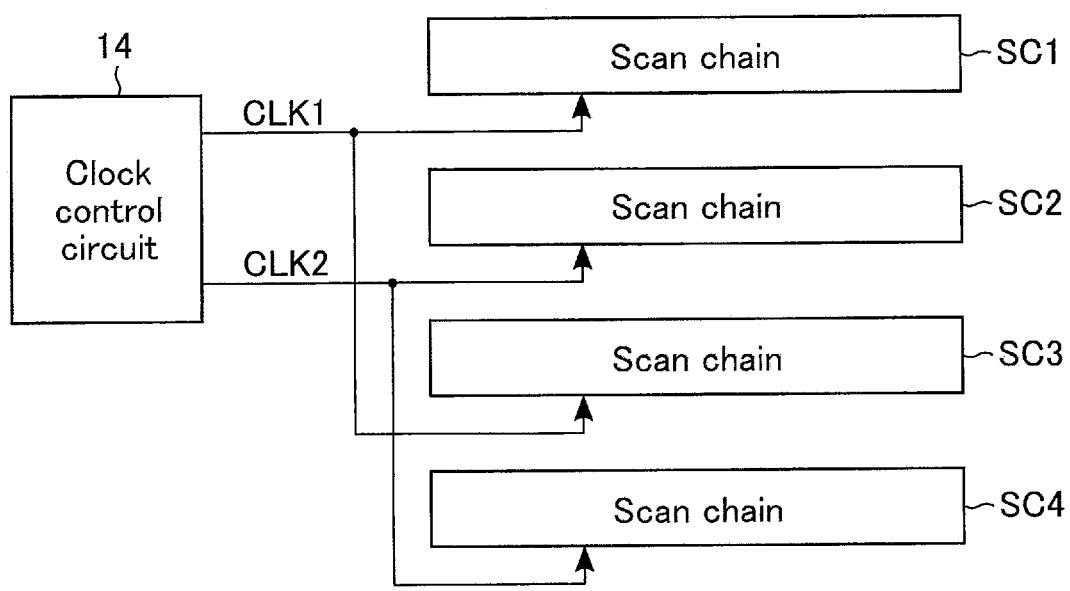
FIG. 5 is a schematic diagram for explaining a clock path of the scan chains.

FIG. 5 is a schematic diagram for explaining a clock path of the scan chains SC1 through SC4.

The clock control circuit 14 generates clocks CLK1 and CLK2. The clock CLK1 is supplied to the scan chains SC1 and SC3 via a signal line. The clock CLK2 is supplied to the scan chains SC2 and SC4 via a signal line. In other words, the scan chains SC1 and SC3 operate on a clock differing from the clock on which the scan chains SC2 and SC4 operates.

[1-1-3] Structure of Clock Control Circuit 14

Next, a structure of the clock control circuit 14 will be described. FIG. 6 is a circuit diagram of the clock control circuit 14.

The clock control circuit 14 includes a selector 30 and a selector 31, a delay element 32, and an AND gate 33.

A system clock CLK_S is input to a first input terminal of the selector 30, a test clock CLK_T is input to a second input terminal of the selector 30, and a select signal SEL is input from the LBIST control circuit 15 to a control terminal of the selector 30. The clock output from the selector 30 is indicated as clock CLK1. The system clock CLK_S and the test clock CLK_T are supplied from an external device of the semiconductor device 10, for example.

The output terminal of the selector 30 is coupled to the input terminal of the delay element 32 and to the first input terminal of the selector 31. The output terminal of the delay element 32 is coupled to a second input terminal of the selector 31. The delay element 32 is an element that delays an input signal by a predetermined length of time, and consists of a buffer, for example.

A scan mode signal SCM is input from the LBIST control circuit 15 to the first input terminal of the AND gate 33, and a scan enable signal EN is input from the LBIST control circuit 15 to the second input terminal of the AND gate 33. The AND gate 33 performs an AND operation (logical product). The output terminal of the AND gate 33 is coupled to the control terminal of the selector 31. The clock output from the selector 31 is indicated as clock CLK2.

During a system operation, a select signal SEL and a scan mode signal SCM are at a low level. If a select signal SEL is at a low level, the selector 30 outputs a system clock CLK_S as the clock CLK1.

If the scan mode signal SCM is at a low level, the output of the AND gate 33 is also at a low level. If the output of the AND gate 33 is at a low level, the selector 31 outputs the clock CLK1 as-is as the clock CLK2. The clock control circuit 14 thus outputs a system clock CLK_S as the clocks CLK1 and CLK2.

During a test operation, the select signal SEL, the scan mode signal SCM, and the scan enable signal EN are at a high level. If the select signal SEL is at a low level, the selector 30 outputs a test clock CLK_T.

If the scan mode signal SCM and the scan enable signal EN are at a high level, the output of the AND gate 33 is also at a high level. If the output of the AND gate 33 is at a high level, the selector 31 outputs the clock CLK1 delayed by the delay element 32 as the clock CLK2. The clock control circuit 14 thereby outputs the clock CLK1 and the CLK2 which corresponds to the delayed clock CLK1. The clock CLK1 is input to the scan chain SC1 for example, and the clock CLK2 is input to the scan chain SC2, for example.

Figure 7:
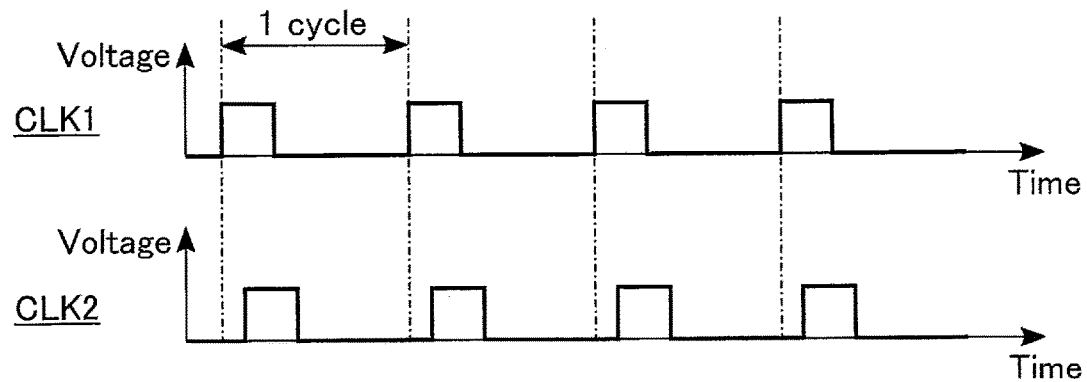
FIG. 7 is a timing diagram of clocks during testing.

FIG. 7 is a timing diagram of clocks CLK1 and CLK2 during testing. The rising edge of the clock CLK2 occurs later than the rising edge of the clock CLK1. In other words, the clock control circuit 14 can generate two types of clock having different rising edge timings by using the test clock CLK_T. The cycles of the clocks CLK1 and CLK2 are the same.

[1-2] Operation

Figure 8:
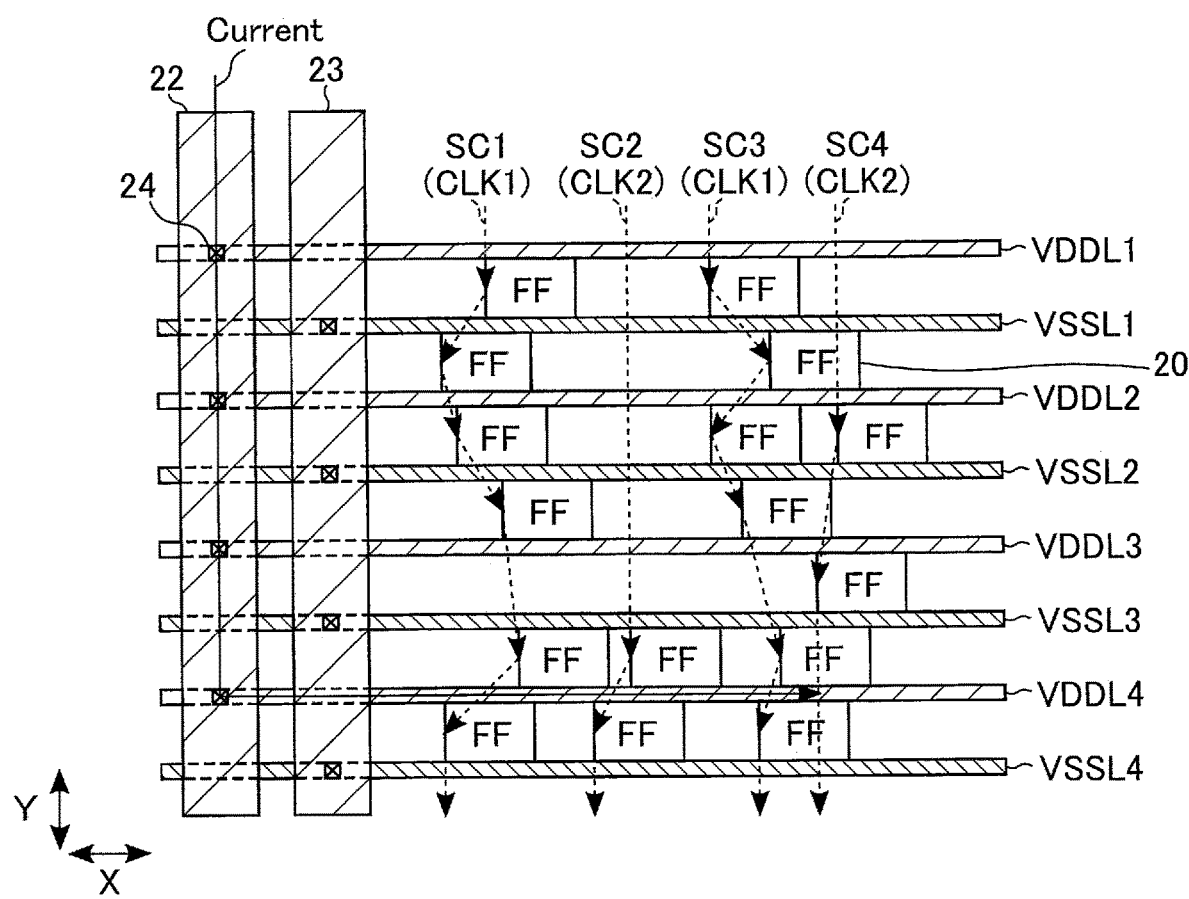
FIG. 8 is a schematic diagram for explaining an operation of the semiconductor device.

The operation of the semiconductor device 10 structured as described above will be described. FIG. 8 is a schematic diagram for explaining an operation of the semiconductor device 10.

In the present embodiment, a single scan chain SC is comprised of scan flip-flops 20 cascaded in the Y direction, which is a direction orthogonal to the power supply lines VDDL and the ground lines VSSL. In this case, in a single scan chain SC, maximum two scan flip-flops 20 sharing a power supply line VDDL operate simultaneously.

The scan chains SC1 and SC3 operate in synchronization with the clock CLK1, and the scan chains SC2 and SC4 operate in synchronization with the clock CLK2. In other words, the scan chains SC1 and SC3 do not operate at the same time as the scan chains SC2 and SC4 operate.

FIG. 8 indicates a current flowing from the upper layer interconnect 22 to the power supply line VDDL4, with an interest in the power supply line VDDL4. In the scan chain SC1, two scan flip-flops 20 coupled to the power supply line VDDL4 simultaneously operate in synchronization with the clock CLK1. In the scan chain SC3, two scan flip-flops 20 coupled to the power supply line VDDL4 simultaneously operate in synchronization with the clock CLK1.

If a current flowing in a single scan flip-flop 20 is "I", the current flowing in the power supply line VDDL4 is "4I". If an interconnect resistance of the power supply line VDDL4 is "R", a local voltage drop in the power supply line VDDL4 is "4IR".

Focusing on the power supply line VDDL4, two scan flip-flops 20, among those belonging to the scan chain SC2 and coupled to the power supply line VDDL4, simultaneously operate in synchronization with the clock CLK2. In contrast, the scan flip-flops 20 in the part where the scan chain SC4 passes do not operate. In the scan chains SC2 and SC4, the local voltage drop of the power supply line VDDL4 is "2IR".

Thus, in the example shown in FIG. 8, it is possible to achieve a local voltage drop equal to or smaller than "4IR". This is smaller than the local voltage drop "6IR" in the power supply line VDDL4 at the time when the clock CLK1 and the clock CLK2 have the same pulse.

[1-3] Advantageous Effects of First Embodiment

As described above, in the first embodiment, a plurality of flip-flops 20 included in a first scan chain SC1 are arranged along a direction orthogonal to the power supply lines VDDL, and similarly, a plurality of flip-flops 20 included in a second scan chain SC2 are arranged along a direction orthogonal to the power supply lines VDDL. Then, two types of clock having different rising edge timing are supplied to the first scan chain SC1 and second scan chain SC2.

According to the first embodiment, it is possible to structure the semiconductor device 10 in such a manner that maximum two scan flip-flops 20 sharing a power supply line VDDL operate simultaneously in a single scan chain SC. In other words, it is possible to reduce the number of scan flip-flops 20 simultaneously operating per power supply line VDDL. It is thereby possible to achieve a smaller local voltage drop through reducing a peak power of a power supply line. As a result, a test operation can be more accurately performed.

Furthermore, it is also possible to stagger the operation timing of the first scan chain SC1 and the second scan chain SC2. It is thereby possible to achieve a smaller local voltage drop.

[2] Second Embodiment

Figure 9:
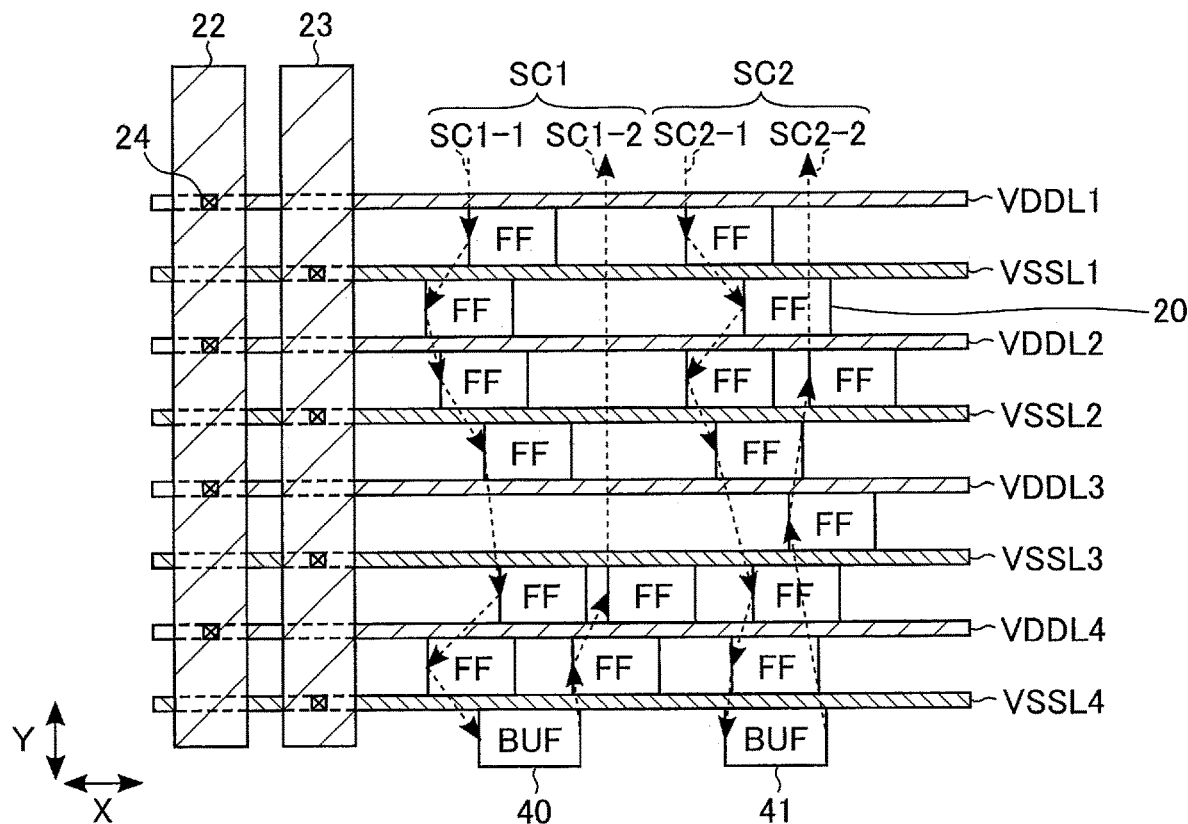
FIG. 9 is a plan view of a logic circuit that includes a plurality of scan chains according to a second embodiment.

FIG. 9 is a plan view of a logic circuit 11 that includes a plurality of scan chains SC according to the second embodiment. FIG. 9 shows two scan chains SC1 and SC2 as an example.

The scan chain SC1 is comprised of a first scan chain SC1-1, a delay element 40, and a second scan chain SC1-2, coupled in series.

The first scan chain SC1-1 is comprised of scan flip-flops 20 which are cascaded in a downward fashion in the drawing. The input terminal of the scan flip-flop 20 in the final stage of the first scan chain SC1-1 is coupled to the input terminal of the delay element 40. The delay element 40 consists of a buffer, for example.

The output terminal of the delay element 40 is coupled to the scan flip-flop 20 of the first stage of the second scan chain SC1-2. The second scan chain SC1-2 is comprised of the scan flip-flops 20 cascaded in an upward fashion in the drawing.

Figure 10:
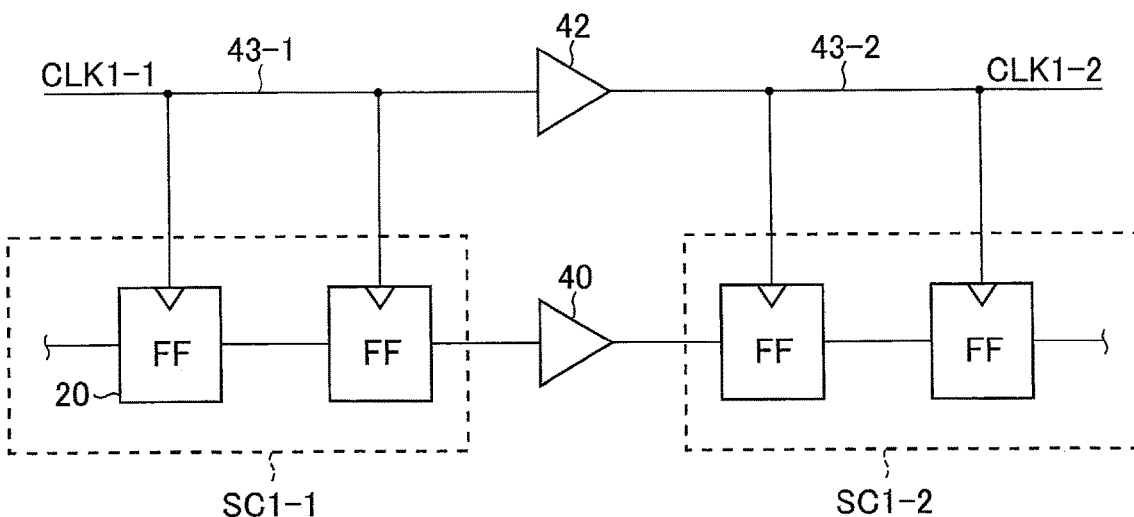
FIG. 10 is a circuit diagram for explaining a scan chain and a clock signal line.

FIG. 10 is a circuit diagram for explaining the scan chain SC1 and the clock signal line. The first scan chain SC1-1, the delay element 40, and the second scan chain SC1-2 are coupled in series.

The clock signal line 43-1 is coupled to the clock terminal of the scan flip-flop 20 included in the first scan chain SC1-1. The clock signal line 43-1 is coupled to the input terminal of the delay element 42. A clock CLK1-1 is supplied to the clock signal line 43-1 from the clock control circuit 14.

The delay element 42 consists of a buffer, for example. A delay amount of the delay element 42 is set to approximately the same value as a delay amount of the delay element 40. The delay element 42 outputs a clock CLK1-2, which is the clock CLK1-1 delayed by a predetermined length of time.

The output terminal of the delay element 42 is coupled to the clock signal line 43-2. The clock signal line 43-2 is coupled to the clock terminal of the scan flip-flop 20 included in the second scan chain SC1-2.

Similarly, in FIG. 9, the scan chain SC2 is comprised of a first scan chain SC2-1, a delay element 41, and a second scan chain SC2-2, coupled in series.

The first scan chain SC2-1 is comprised of the scan flip-flops 20 cascaded in a downward fashion in the drawing. The scan flip-flop 20 of the final stage of the first scan chain SC2-1 is coupled to the input terminal of the delay element 41. The delay element 41 consists of a buffer, for example.

The output terminal of the delay element 41 is coupled to the scan flip-flop 20 of the first stage of the second scan chain SC2-2. The second scan chain SC2-2 is comprised of the scan flip-flops 20 inversely cascaded in an upward fashion in the drawing.

FIG. 11 is a circuit diagram for explaining the scan chain SC2 and the clock signal line. The first scan chain SC2-1, the delay element 41, and the second scan chain SC2-2 are coupled in series.

The clock signal line 45-1 is coupled to the clock terminal of the scan flip-flop 20 included in the first scan chain SC2-1.

The clock signal line 45-1 is coupled to the input terminal of the delay element 44. A clock CLK2-1 is supplied to the clock signal line 45-1 from the clock control circuit 14.

The delay element 44 consists of a buffer, for example. A delay amount of the delay element 44 is set to the same as a delay amount of the delay element 41. The delay element 44 outputs a clock CLK2-2, which is the clock CLK2-1 delayed by a predetermined length of time.

The output terminal of the delay element 44 is coupled to the clock signal line 45-2. The clock signal line 45-2 is coupled to the clock terminal of the scan flip-flop 20 included in the second scan chain SC2-2.

FIG. 12 is a timing diagram of the clocks CLK1-1, CLK1-2, CLK2-1, and CLK2-2 during testing.

The rising edges of the clocks CLK1-1, CLK1-2, CLK2-1, and CLK2-2 delay in this order. The cycles of the clocks CLK1-1, CLK1-2, CLK2-1, and CLK2-2 are the same. In other words, in the second embodiment, it is possible to generate four different types of clock having different timing (namely clocks CLK1-1, CLK1-2, CLK2-1, and CLK2-2), using two clocks CLK1-1 and CLK2-1 having different rising edge timing.

In the semiconductor device 10 structured as described above, the first scan chain SC1-1 included in the scan chain SC1 operates in synchronization with the clock CLK1-1, the second scan chain SC1-2 included in the scan chain SC1 operates in synchronization with the clock CLK1-2, the first scan chain SC2-1 included in the scan chain SC2 operates in synchronization with the clock CLK2-1, and the second scan chain SC2-2 included in the scan chain SC2 operates in synchronization with the clock CLK2-2. In other words, it is possible to stagger the operation timing of the four scan chains, SC1-1, SC1-2, SC2-1, and SC2-2.

In the second embodiment, a maximum of two scan flip-flops 20 sharing a power supply line VDDL operate simultaneously. Thus, it is possible to make the local voltage drop equal to or smaller than "2IR".

[3] Third Embodiment

Figure 13:
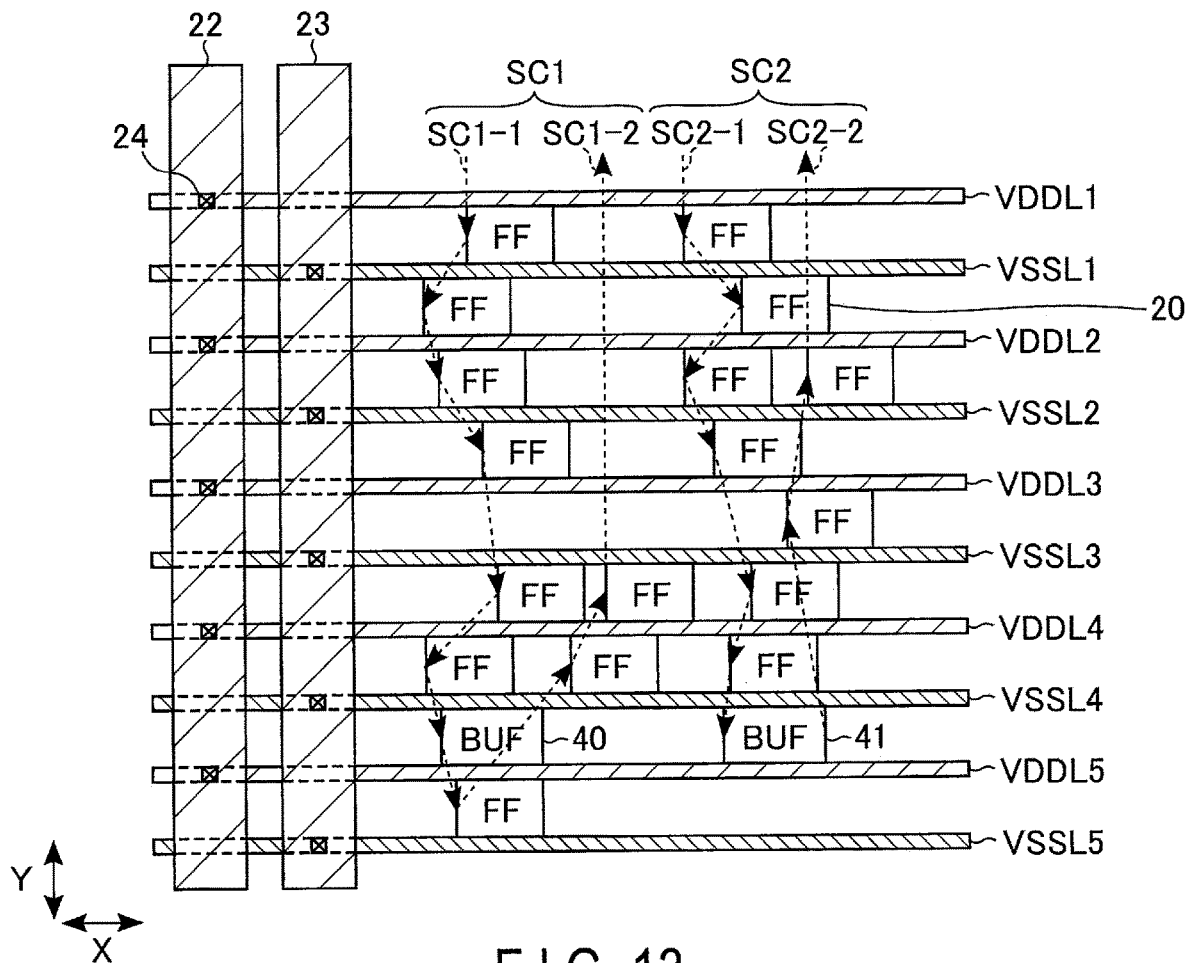
FIG. 13 is a plan view of a logic circuit that includes a plurality of scan chains according to a third embodiment.

FIG. 13 is a plan view of the logic circuit 11 that includes a plurality of scan chains SC according to the third embodiment.

In the logic circuit 11, a power supply line VDDL5 and a ground line VSSL5 are further arranged. The upper layer interconnect 22 is coupled to the power supply line VDDL5 via the contacts 24. The upper layer interconnect 23 is coupled to the ground line VSSL5 via the contacts 24.

The scan flip-flop 20 included in the first scan chain SC1-1 is coupled to the power supply line VDDL5 and the ground line VSSL5.

The delay element 40 is arranged among the plurality of scan flip-flops 20 included in the first scan chain SC1-1, not at the edge of the first scan chain SC1-1. In the example shown in FIG. 13, the delay element 40 is coupled between the scan flip-flop 20 coupled to the power supply line VDDL4 and the scan flip-flop 20 coupled to the power supply line VDDL5.

Figure 14:
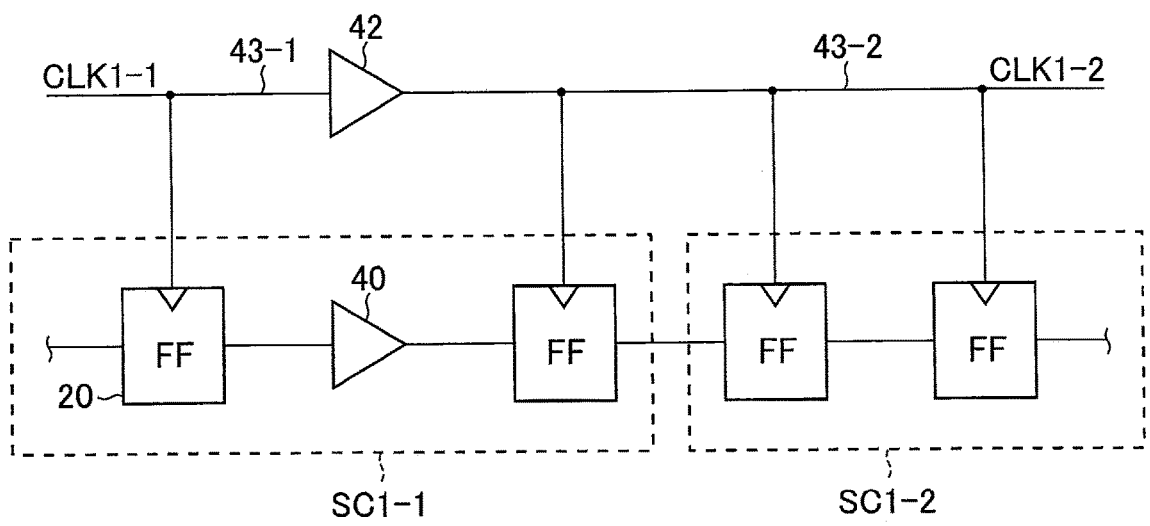
FIG. 14 is a circuit diagram for explaining a scan chain and a clock signal line.

FIG. 14 is a circuit diagram for explaining the scan chain SC1 and the clock signal line. The delay element 40 is coupled between the scan flip-flops 20 included in the first scan chain SC1-1. The first scan chain SC1-1 and the second scan chain SC1-2 are coupled in series.

The input terminal of the delay element 42 is coupled to the clock signal line 43-1, and the output terminal of the delay element 42 is coupled to the clock signal line 43-2.

The clock signal line 43-1 is coupled to the clock terminal of the scan flip-flop 20 on the input side of the delay element 40, among the scan flip-flops 20 belonging to the first scan chain SC1-1. The clock signal line 43-2 is coupled to, in the first scan chain SC1-1, the clock terminal of the scan flip-flop 20 on the output side of the delay element 40, and to the second scan chain SC1-2. In the second embodiment, the scan chains are folded back at the delay element 40; in contrast, the scan chains are folded back at the scan flip-flop 20 in the third embodiment.

As described above, it is possible to arrange the delay element 40 at a location other than the edge of the first scan chain SC1-1. In the third embodiment, it is possible to obtain the same advantageous effect as that obtained in the second embodiment.

[4] Fourth Embodiment

Figure 15:
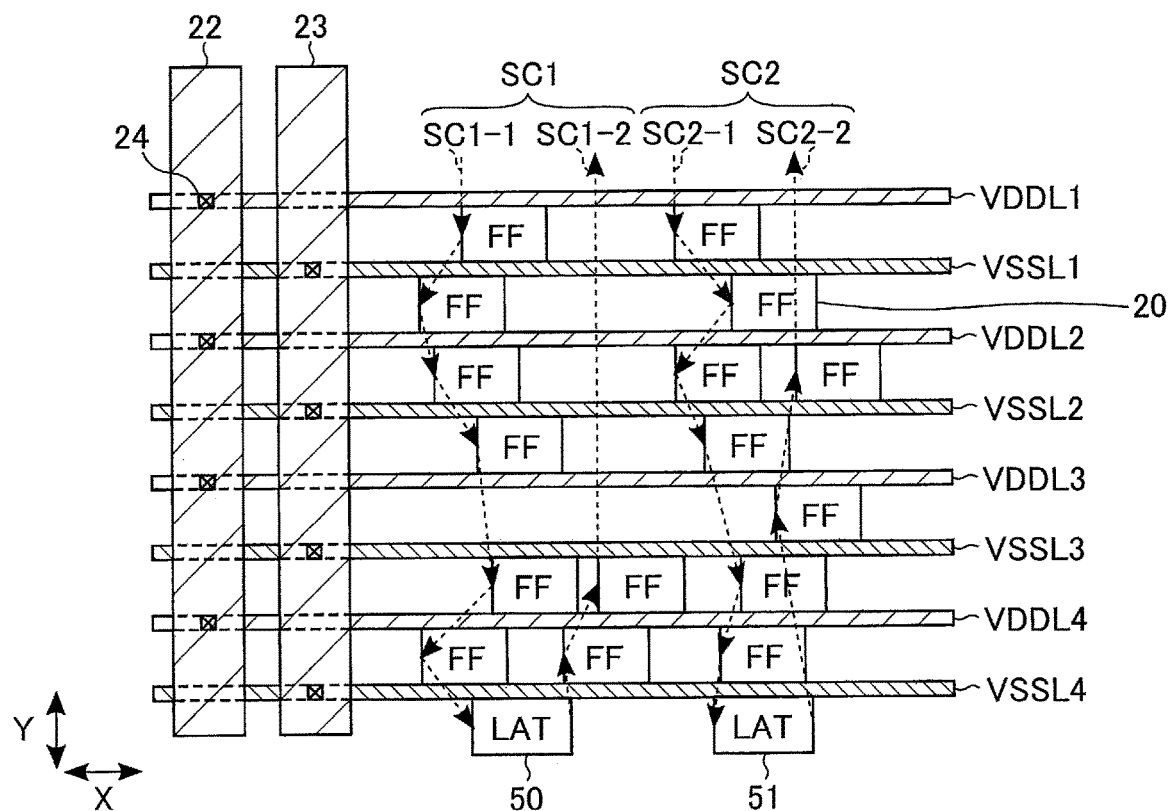
FIG. 15 is a plan view of a logic circuit that includes a plurality of scan chains according to a fourth embodiment.

FIG. 15 is a plan view of the logic circuit 11 that includes a plurality of scan chains SC according to the fourth embodiment.

The scan chain SC1 is comprised of a first scan chain SC1-1, a latch circuit (LAT) 50, and a second scan chain SC1-2, coupled in series.

The scan flip-flop 20 of the final stage of the first scan chain SC1-1 is coupled to the input terminal of the latch circuit 50. The output terminal of the latch circuit 50 is coupled to the scan flip-flop 20 of the first stage of the second scan chain SC1-2. The latch circuit 50 retains data in accordance with a clock.

The scan chain SC2 is comprised of a first scan chain SC2-1, a latch circuit 51, and a second scan chain SC2-2 coupled in series.

The scan flip-flop 20 of the final stage of the first scan chain SC2-1 is coupled to the input terminal of the latch circuit 51. The output terminal of the latch circuit 51 is coupled to the scan flip-flop 20 of the first stage of the second scan chain SC2-2. The latch circuit 51 retains data in accordance with a clock.

Figure 16:
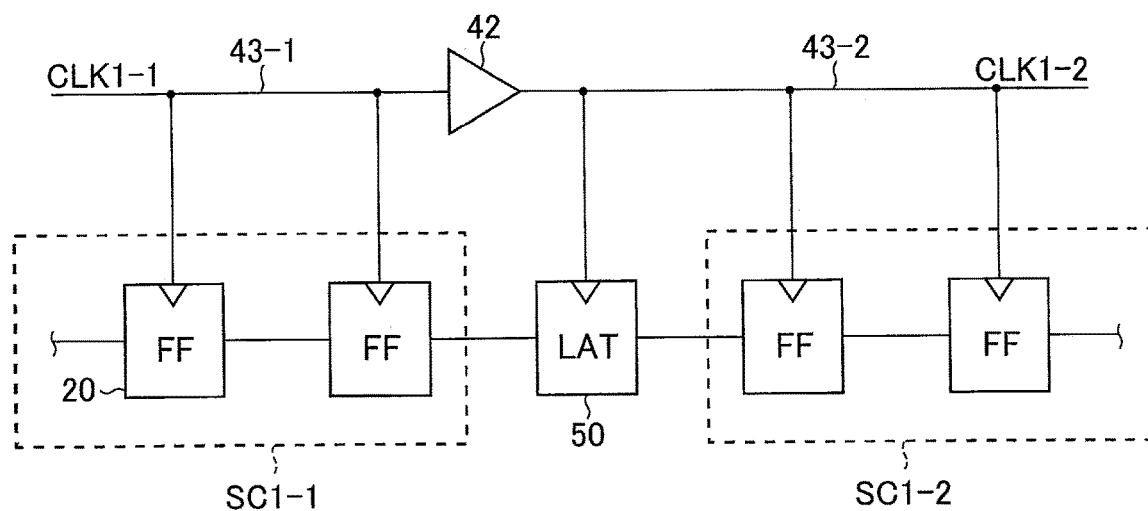
FIG. 16 is a circuit diagram for explaining a scan chain and a clock signal line.

FIG. 16 is a circuit diagram for explaining the scan chain SC1 and the clock signal line. The first scan chain SC1-1, the latch circuit 50, and the second scan chain SC1-2 are coupled in series.

The clock signal line 43-1 is coupled to the clock terminal of the scan flip-flop 20 included in the first scan chain SC1-1. The clock signal line 43-1 is coupled to the input terminal of the delay element 42. A clock CLK1-1 is supplied to the clock signal line 43-1 from the clock control circuit 14.

The delay element 42 outputs a clock CLK1-2, which is the clock CLK1-1 delayed by a predetermined length of time.

The output terminal of the delay element 42 is coupled to the clock signal line 43-2. The clock signal line 43-2 is coupled to the clock terminal of the latch circuit 50, and the clock terminal of the scan flip-flop 20 included in the second scan chain SC1-2. The latch circuit 50 retains data in accordance with the clock CLK1-2.

Since the relationship between the scan chain SC2 and the clock signal line is the same as the scan chain SC1 shown in FIG. 16, the illustration is omitted.

According to the fourth embodiment, it is possible to operate the first scan chain SC1-1, and the second scan chain SC1-2 among the scan chains SC1 can operate by two different clocks having different rising-edge timing. It is also possible to operate the first scan chain SC1-1 and the second scan chain SC1-2 in accordance with the timings of two types of clock.

Furthermore, it is possible to reduce the number of scan flip-flops 20 simultaneously operating per power supply line VDDL. It is thereby possible to achieve a smaller local voltage drop.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first scan chain and a second scan chain each including a plurality of cascaded flip-flops;
a plurality of power supply lines that supply a power supply voltage to the first and second scan chains, extend in a first direction, and are arranged in a second direction intersecting with the first direction;
a first signal line coupled to a clock terminal of the first scan chain;
a second signal line coupled to a clock terminal of the second scan chain; and
a clock control circuit that supplies a first clock to the first signal line and a second clock to the second signal line, the second clock having timing different to that of the first clock, wherein
each of the power supply lines is connected to a group of flip-flops arranged in the first direction, and
the plurality of cascaded flip-flops are arranged along the second direction.

2. The semiconductor device according to claim 1, wherein
the plurality of cascaded flip-flops are arranged in such a manner that a maximum of two flip-flops are coupled to one power supply line.

3. The semiconductor device according to claim 1, further comprising:
a first interconnect coupled to the plurality of power supply lines in common and extending in the second direction.

4. The semiconductor device according to claim 1, further comprising:
a plurality of ground lines that supply a ground voltage to the first and second scan chains, extend in the first direction, and are arranged in the second direction.

5. The semiconductor device according to claim 4, further comprising:
a second interconnect coupled to the plurality of ground lines in common and extending in the second direction.

6. The semiconductor device according to claim 1, further comprising:
a generator that supplies a test pattern to the first and second scan chains; and
a compressor that compresses a pattern output from the first and second scan chains.

7. A semiconductor device comprising:
a first scan chain and a second scan chain that each includes a plurality of cascaded flip-flops;
a plurality of power supply lines that supply a power supply voltage to the first and second scan chains, extend in a first direction, and are arranged in a second direction intersecting with the first direction;

a first signal line coupled to a clock terminal of the first scan chain;

a second signal line coupled to a clock terminal of the second scan chain;

a first delay element coupled between the first scan chain and the second scan chain;

a second delay element coupled between the first signal line and the second signal line; and a clock control circuit that supplies a clock to the first signal line, wherein each of the power supply lines is connected to a group of flip-flops arranged in the first direction, and the plurality of cascaded flip-flops are arranged along the second direction.

8. The semiconductor device according to claim 7, wherein the first delay element is arranged at an edge of the first scan chain.

9. The semiconductor device according to claim 7, wherein the first delay element is arranged at a location other than an edge of the first scan chain.

10. The semiconductor device according to claim 7, wherein the plurality of cascaded flip-flops are arranged in such a manner that a maximum of two flip-flops are coupled to one power supply line.

11. The semiconductor device according to claim 7, further comprising:

a first interconnect coupled to the plurality of power supply lines in common and extending in the second direction.

12. The semiconductor device according to claim 7, further comprising:

a plurality of ground lines that supply a ground voltage to the first and second scan chains, extend in the first direction, and are arranged in the second direction.

13. The semiconductor device according to claim 12, further comprising:

a second interconnect coupled to the plurality of ground lines in common and extending in the second direction.

14. The semiconductor device according to claim 7, further comprising:

a generator that generates a test pattern for the first scan chain; and a compressor that compresses a pattern output from the second scan chain.

15. A semiconductor device comprising:

a first scan chain and a second scan chain that each includes a plurality of cascaded flip-flops;

a plurality of power supply lines that supply a power supply voltage to the first and second scan chains, extend in a first direction, and are arranged in a second direction intersecting with the first direction;

a latch circuit coupled between the first scan chain and the second scan chain;

a first signal line coupled to a clock terminal of the first scan chain;

a second signal line coupled to a clock terminal of the second scan chain and a clock terminal of the latch circuit;

a delay element coupled between the first signal line and the second signal line; and a clock control circuit that supplies a clock to the first signal line, wherein each of the power supply lines is connected to a group of flip-flops arranged in the first direction, and the plurality of cascaded flip-flops are arranged along the second direction.

16. The semiconductor device according to claim 15, wherein the plurality of cascaded flip-flops are arranged in such a manner that maximum two of the flip-flops are coupled to one power supply line.

17. The semiconductor device according to claim 15, further comprising:

a first interconnect coupled to the plurality of power supply lines in common and extending in the second direction.

18. The semiconductor device according to claim 15, further comprising:

a plurality of ground lines that supply a ground voltage to the first and second scan chains, extend in the first direction, and are arranged in the second direction.

19. The semiconductor device according to claim 18, further comprising:

a second interconnect coupled to the plurality of ground lines in common and extending in the second direction.

20. The semiconductor device according to claim 15, further comprising:

a generator that generates a test pattern for the first scan chain; and a compressor that compresses a pattern output from the second scan chain.

* * * * *